United States Patent
Lee et al.

(10) Patent No.: US 10,014,436 B2
(45) Date of Patent: Jul. 3, 2018

(54) METHOD FOR MANUFACTURING A LIGHT EMITTING ELEMENT

(71) Applicant: XIAMEN SANAN OPTOELECTRONICS TECHNOLOGY CO., LTD., Xiamen (CN)

(72) Inventors: Cheng-Hung Lee, Xiamen (CN); Sheng-Wei Chou, Xiamen (CN); Chi-Hung Lin, Xiamen (CN); Chan-Chan Ling, Xiamen (CN); Chia-Hung Chang, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 15/424,942

(22) Filed: Feb. 6, 2017

(65) Prior Publication Data
US 2017/0148945 A1 May 25, 2017

Related U.S. Application Data

(63) Continuation of application No. PCT/CN2015/097359, filed on Dec. 15, 2015.

(30) Foreign Application Priority Data

Dec. 17, 2014 (CN) .......................... 2014 1 0780653

(51) Int. Cl.
*H01L 33/00* (2010.01)
*H01L 33/32* (2010.01)
(Continued)

(52) U.S. Cl.
CPC ............ *H01L 33/007* (2013.01); *H01L 33/12* (2013.01); *H01L 33/32* (2013.01); *H01L 33/20* (2013.01)

(58) Field of Classification Search
CPC ....... H01L 33/007; H01L 33/32; H01L 33/12; H01L 33/20
See application file for complete search history.

(56) References Cited

U.S. PATENT DOCUMENTS 5,926,726 A * 7/1999 Bour ....................... C30B 25/02
257/E21.11
6,924,159 B2 8/2005 Usui et al.
(Continued)

FOREIGN PATENT DOCUMENTS

CN 103258930 A 8/2013
CN 103296151 A 9/2013

OTHER PUBLICATIONS

Ratna Shekhar, Klavs F. Jensen,"Temperature programmed desorption investigations of hydrogen and ammonia reactions on GaN", Surface Science vol. 381, 1997, pp. L581-L588.*

*Primary Examiner* — William Coleman
(74) *Attorney, Agent, or Firm* — Syncoda LLC; Feng Ma; Junjie Feng

(57) ABSTRACT

A method for manufacturing a light emitting element includes: a GaN layer is formed on an AlN-deposited plain or patterned substrate, and the stress between different materials is changed and buffered through thermal treatment of annealing under $H_2$ atmosphere or under $H_2$ and $NH_3$ mixed atmosphere, thus eliminating epitaxial wafer warp caused by such stress and improving epitaxial quality and light-emitting efficiency of the light-emitting element.

16 Claims, 10 Drawing Sheets

(51) Int. Cl.
*H01L 33/12* (2010.01)
*H01L 33/20* (2010.01)

(56) References Cited

U.S. PATENT DOCUMENTS

| | | | | |
|---|---|---|---|---|
| 8,537,944 B2* | 9/2013 | Menkhoff | .......... | H03H 17/0276 |
| | | | | 375/350 |
| 8,575,968 B2* | 11/2013 | Cyrusian | ............... | H03F 3/2173 |
| | | | | 327/108 |
| 9,130,068 B2* | 9/2015 | Yang | ....................... | H01L 33/12 |
| 9,627,199 B2* | 4/2017 | Motayed | ............. | H01L 21/0259 |

* cited by examiner

METHOD FOR MANUFACTURING A LIGHT EMITTING ELEMENT

CROSS-REFERENCE TO RELATED APPLICATIONS

The present application is a continuation of, and claims priority to, PCT/CN2015/097359 filed on Dec. 15, 2015, which claims priority to Chinese Patent Application No. 201410780653.6 filed on Dec. 17, 2014. The disclosures of these applications are hereby incorporated by reference in their entirety.

BACKGROUND

With advantages of energy saving, environmental protection and long service life, light emitting diodes are widely applied in fields like LCD backlight, outdoor display, landscape lighting and general lighting. At present, most blue- and green-light-emitting devices are nitride-based semiconductors, whose epitaxial growth mainly is divided into homoepitaxial growth and heteroepitaxial growth. In homoepitaxial growth, a substrate with lattice match of the nitride-based semiconductor is used, such as a GaN substrate; and in heteroepitaxial growth, a substrate with lattice mismatch of the nitride-based semiconductor lattice is used, such as a sapphire substrate or a Si substrate.

As substrates with homoepitaxial growth are generally higher-cost, most substrates are formed via heteroepitaxial growth. However, given the considerable crystal lattice stress between the heterogeneous substrate and the nitride-based semiconductor layer, in current process, a low-temperature GaN (AlGaN) non-lattice layer is formed on the substrate, and a high-quality GaN layer is then formed to gradually eliminate defects caused by the stress. However, the epitaxial structure formed in this way remains as high as $1\times10^8$-$1\times10^{10}$ cm$^{-2}$ defect concentration and causes carrier leakage and increasing non-radiative recombination centers, thereby decreasing internal quantum efficiency (IQE) of the device.

SUMMARY

To solve the problems mentioned above, various embodiments disclosed herein provide a method for manufacturing a light emitting element, in which, a GaN layer is formed on an AlN-deposited plain or patterned substrate, and the stress between different materials is buffered through special thermal treatment, thus eliminating epitaxial wafer warp caused by the stress and improving epitaxial quality and light-emitting efficiency of the light-emitting element.

According to some embodiments, a method for manufacturing a light emitting element is provided, which can solve the problems above. The method can include: 1) providing a substrate; 2) depositing an AlN layer on the substrate surface via PVD; 3) turning on the metal source and NH$_3$, and depositing an Al$_x$Ga$_{1-x}$N (0≤x<1) layer on the AlN layer surface via MOCVD method; 4) annealing the Al$_x$Ga$_{1-x}$N layer to form an Al$_x$Ga$_{1-x}$N layer in irregular or island-like shape, specifically: turning off the metal source and NH$_3$, keeping continual input of H$_2$, rising chamber temperature, and annealing the Al$_x$Ga$_{1-x}$N layer under H$_2$ atmosphere; then, continually rising temperature and inputting NH$_3$ when is H$_2$ input; and continuing annealing the Al$_x$Ga$_{1-x}$N layer under NH$_3$ atmosphere; 5) depositing a GaN layer on the annealed Al$_x$Ga$_{1-x}$N layer surface; and 6) depositing an n-type layer, a light-emitting layer and a P-type layer on the GaN layer surface.

Preferably, annealing temperature under H$_2$ atmosphere is 400-1200° C., and annealing time is 100-600 s.

Preferably, annealing temperature under NH$_3$/H$_2$ mixed atmosphere is 400-1200° C., and annealing time is 100-500 s.

Preferably, total annealing time under H$_2$ and NH$_3$/H$_2$ mixed atmosphere is 200-600 s.

Preferably, growing temperature for the Al$_x$Ga$_{1-x}$N layer is 400-600° C.

Preferably, thickness of the Al$_x$Ga$_{1-x}$N layer is 10-1000 Å.

Preferably, thickness of the AlN layer is 10-350 Å.

Preferably, after annealing, the chamber temperature is adjusted to 950-1150° C. for depositing the GaN layer.

Preferably, the substrate is a plain substrate, a convex-patterned substrate or a concave-patterned substrate.

In another aspect, a method for manufacturing a light emitting element is provided, the method comprising: 1) providing a substrate; 2) depositing an AlN layer on the substrate surface via PVD; 3) turning on the metal source and NH$_3$, and depositing an Al$_x$Ga$_{1-x}$N (0≤x<1) layer on the AlN layer surface via MOCVD method; 4) annealing the Al$_x$Ga$_{1-x}$N layer to form an Al$_x$Ga$_{1-x}$N layer in irregular or island-like shape, specifically: turning off the metal source and NH$_3$, keeping continual input of H$_2$, rising chamber temperature, and annealing the Al$_x$Ga$_{1-x}$N layer under H$_2$ atmosphere; 5) depositing a GaN layer on the annealed Al$_x$Ga$_{1-x}$N layer; and 6) depositing an n-type layer, a light-emitting layer and a P-type layer on the GaN layer surface.

Preferably, annealing temperature under H$_2$ atmosphere is 400-1200° C., and temperature-rising time is 100-500 s.

Preferably, growing temperature for the Al$_x$Ga$_{1-x}$N layer is 400-600° C.

Preferably, thickness of the Al$_x$Ga$_{1-x}$N layer is 10-1,000 Å.

Preferably, thickness of the AlN layer is 10-350 Å.

Preferably, after annealing, the chamber temperature is adjusted to 950-1150° C. for depositing the GaN layer.

Preferably, the substrate is a plain substrate, a convex-patterned substrate or a concave-patterned substrate.

In another aspect, a light-emitting diode is provided using the methods described above.

In another aspect, a light-emitting system is provided including a plurality of the light-emitting diodes. The light-emitting system can be used, for example, in lighting, displays, signage, etc.

Embodiments disclosed herein can have one or more of the following advantageous: through annealing, an irregular or island-like shape is formed on the surface of the Al$_x$Ga$_{1-x}$N (0≤x<1) layer; in addition, annealing time and temperature under different atmospheres are adjusted flexibly on the basis of actual requirements, so that the buffer range of this layer against the stress is expanded and the interface between the Al$_x$Ga$_{1-x}$N (0≤x<1) layer and the AlN layer is optimized. Therefore, abnormal warp of the epitaxial layer caused by such stress is eliminated, and wavelength uniformity is improved, which is more significant for large-size wafers, thereby finally cutting product cost and improving effective output.

BRIEF DESCRIPTION OF THE DRAWINGS

The accompanying drawings, which are included to provide a further understanding of the invention and constitute a part of this specification, together with the embodiments, are therefore to be considered in all respects as illustrative and not restrictive. In addition, the drawings are merely illustrative, which are not drawn to scale.

Figure 1:
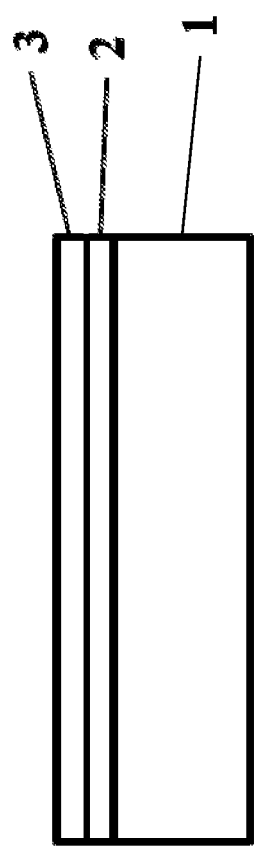
FIG. 1 is a schematic diagram showing the structure after growing of the $Al_xGa_{1-x}N$ ($0 \le x<1$) layer according to Embodiment I of the present invention.

In the drawings: 1. substrate; 11. bottom interval surface of substrate pattern; 12. top surface of substrate pattern; 13. side wall of substrate pattern; 2. AlN film layer; 3. $Al_xGa_{1-x}N$ ($0 \le x<1$) layer; 4. GaN layer; 5. n-type GaN layer; 6. light-emitting layer; 7. p-type GaN layer.

DETAILED DESCRIPTION

Various embodiments of the present disclosure will be described in detail with reference to the accompanying drawings and embodiments.

Embodiment 1

FIGS. 1-4 disclose a first preferred embodiment of the present disclosure. A method for manufacturing a light emitting element is disclosed. At first, a substrate 1 is provided, the material of which may be sapphire, Si or SiC. In this embodiment, a sapphire plain substrate is preferred. The substrate is put into the PVD chamber, with temperature of 300-600° C. and pressure of 2-10 mtorr respectively. A 10-350 nm AlN film layer 2 is deposited via PVD method, and then a substrate deposited with an AlN film layer 2 is transferred to the CVD chamber, and chamber temperature is changed to 400-600° C. Metal source, $NH_3$ and $H_2$ are input for epitaxial growth of an $Al_xGa_{1-x}N$ ($0 \le x<1$) layer 3, which is 10-1,000 Å thick, and covers on the substrate surface. FIG. 1 is a schematic diagram showing the structure after growing the $Al_xGa_{1-x}N$ ($0 \le x<1$) layer.

Figure 2:
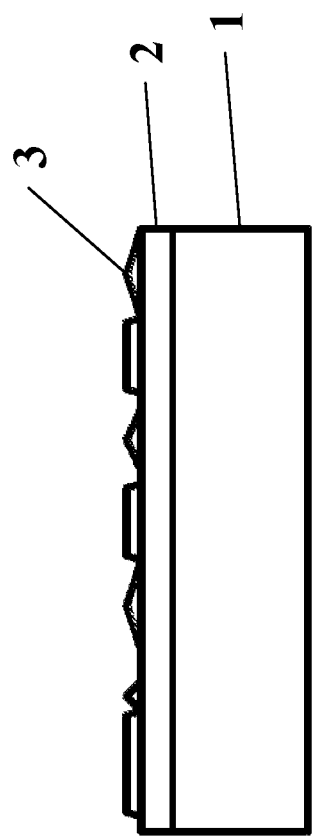
FIG. 2 is a schematic diagram showing the surface pattern after annealing of the $Al_xGa_{1-x}N$ ($0 \le x<1$) layer according to Embodiment I of the present invention.
Figure 4:
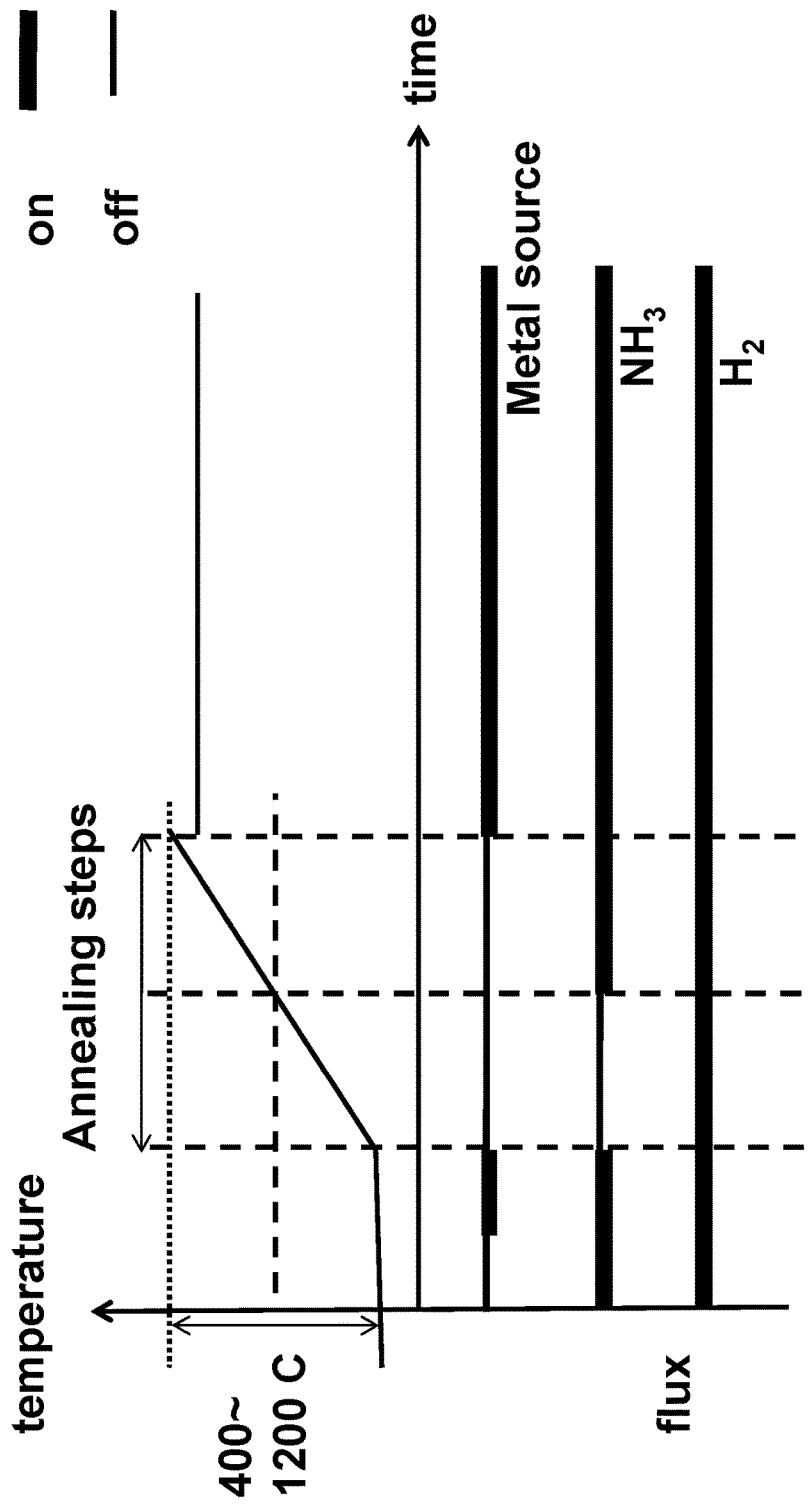
FIG. 4 is a schematic diagram showing the relationship between ON/OFF status of $NH_3$, metal source and $H_2$ valves and temperature change as time goes by according to Embodiments 1 and 3, in which, the X-axis represents time, the upper Y-axis represents temperature and the lower Y-axis represents input of the growth substance.

After depositing of the $Al_xGa_{1-x}N$ ($0 \le x<1$) layer 3, the layer is annealed to form an irregular or island-like shape. Refer to FIG. 2 for the structural diagram. FIG. 4 is a schematic diagram showing the relationship between ON/OFF status of $NH_3$, metal source and $H_2$ valves and temperature change as time goes by. It shows the input source and temperature change inside the reaction chamber during annealing steps. In this embodiment, the annealing method under $H_2$ and $NH_3$ mixed atmosphere is used, comprising annealing steps below: at first, turn off the metal source and $NH_3$ while keeping input of $H_2$, and rise chamber temperature from growth temperature of the $Al_xGa_{1-x}N$ ($0 \le x<1$) layer (400-600° C.) to 400-1,200° C. within 5-500 s for Stage I annealing. In this annealing step under $H_2$ atmosphere, preferably, temperature is changed from 500° C. to 850° C. within 180-220 s; then, input $NH_3$, and continue temperature rising to 400-1200° C. for Stage II annealing. In this annealing step under $NH_3$ atmosphere, preferably, temperature is changed from 850° C. to 1200° C. within 180-210 s to finally form an irregular shape.

Figure 3:
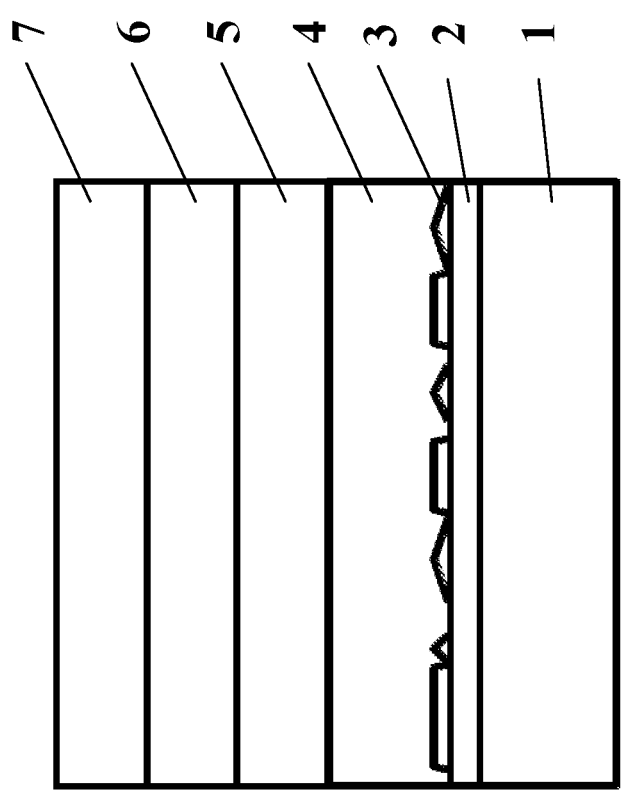
FIG. 3 is a structural diagram of a light emitting diode according to Embodiment I of the present invention.

Then, adjust chamber temperature to 950-1150° C. Input the metal source and continually deposit a GaN layer 4 in irregular or island-like shape. And deposit an n-type layer 5, a light-emitting layer 6 and a p-type layer 7 on the GaN layer 4. Refer to FIG. 3 for the schematic structure.

In this embodiment, the AlN film layer 2 is fabricated via PVD method with isotropic deposition, which has multi-lattice features and superior lattice quality and evenness over the low-temperature buffer layer formed via conventional MOCVD. Therefore, material density and evenness of the $Al_xGa_{1-x}N$ ($0 \le x<1$) layer 3 formed on this film layer are superior over the $Al_xGa_{1-x}N$ ($0 \le x<1$) layer formed on the substrate. When conventional high-temperature annealing conditions are applied, ideal re-crystallization shape is not achievable. Though part of abnormal stress caused by lattice mismatch between the GaN layer 4 and the AlN film layer 2 can be buffered, this buffering capacity is so limited that cannot effectively eliminate abnormal warp of the epitaxial wafer caused by such stress. Therefore, in this embodiment, the annealing under $H_2$ and $NH_3$ mixed atmosphere is adopted. During annealing, annealing conditions of pure $H_2$ atmosphere with degree of etching higher than that of pure $NH_3$ atmosphere are added to form an irregular or island-like shape on the surface of $Al_xGa_{1-x}N$ layer 3 (referring to FIG. 2), so that the stress between the subsequent epitaxial layer and the AlN film layer 2 is effectively reduced. Therefore, abnormal warp of the epitaxial layer caused by such stress is eliminated, quality of the epitaxial layer of the light-emitting element is optimized, and the wavelength evenness of the epitaxial wafer is improved, thereby enhancing light-emitting efficiency of the light-emitting device.

Embodiment 2

Figure 5:
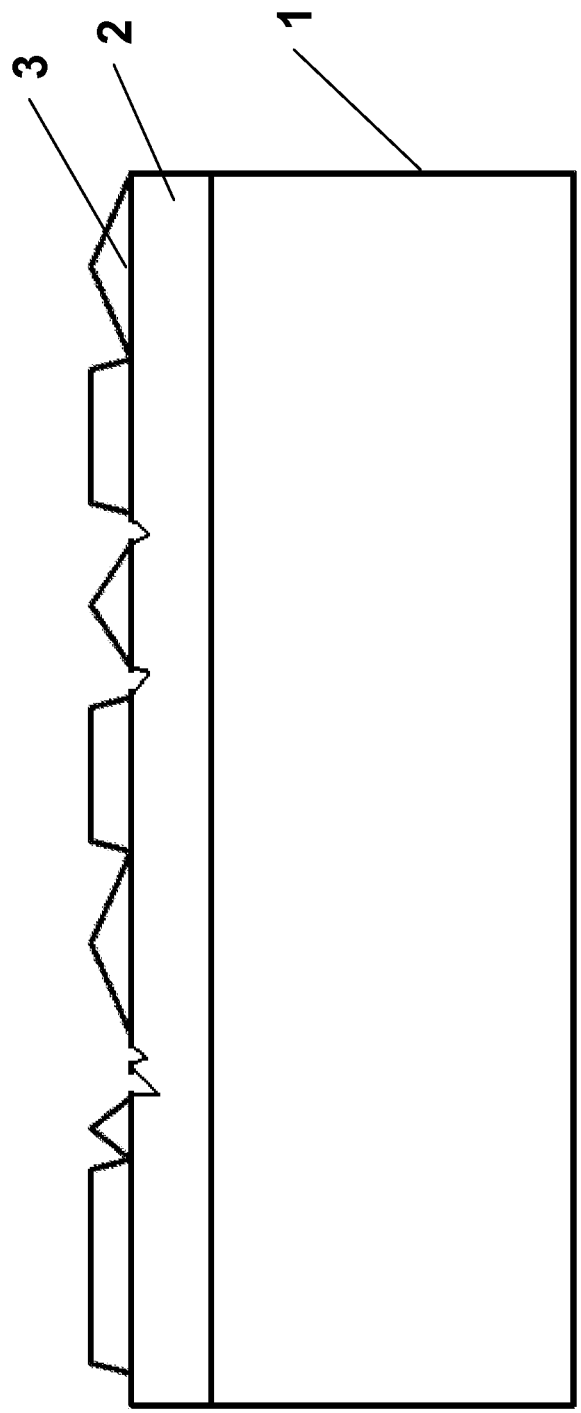
FIG. 5 is a schematic diagram showing the surface pattern after annealing of the $Al_xGa_{1-x}N$ ($0 \le x<1$) layer according to Embodiment II of the present invention.
Figure 6:
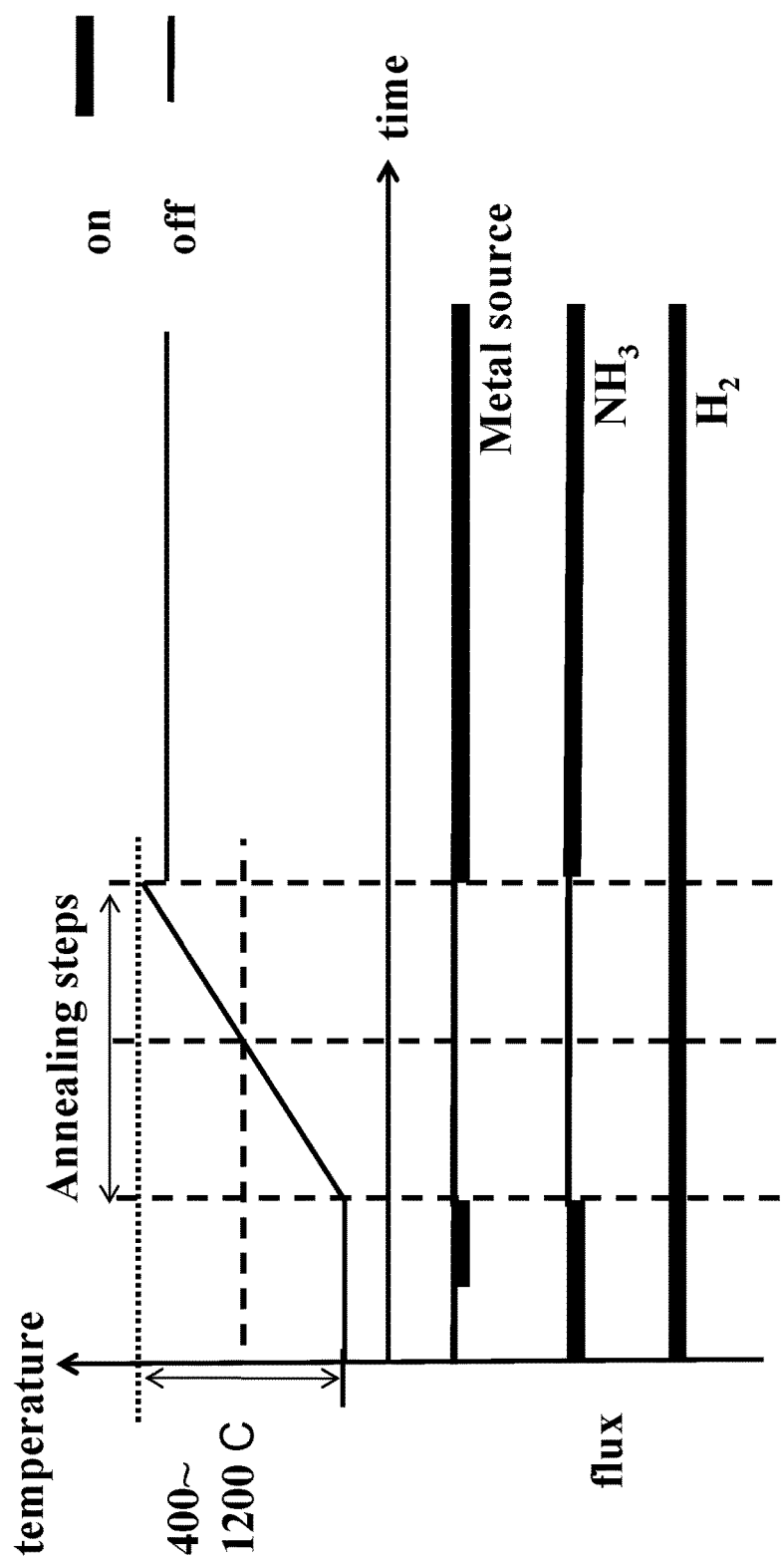
FIG. 6 is a schematic diagram showing the relationship between ON/OFF status of $NH_3$, metal source and $H_2$ valves and temperature change as time goes by according to Embodiments 2 and 4, in which, the X-axis represents time, the upper Y-axis represents temperature and the lower Y-axis represents input of the growth substance.

Referring to FIGS. 5 and 6, the difference between this embodiment and Embodiment 1 is that: the annealing is under pure $H_2$ atmosphere, i.e., turn off the metal source and $NH_3$ while keeping input of $H_2$, and rise chamber temperature from growth temperature of the $Al_xGa_{1-x}N$ ($0 \le x<1$) layer 3 (400-600° C.) to 400-1,200° C. within 5-500 s for annealing. In this annealing step under $H_2$ atmosphere, preferably, temperature is changed from 500° C. to 1,200° C. within 400-450 s; as degree of etching of $H_2$ is higher than $NH_3$, during temperature rising, the $Al_xGa_{1-x}N$ ($0 \le x<1$) layer 3 is re-crystallized, and $H_2$ etches the formed $Al_xGa_{1-x}N$ layer 3. When partially-thinner $Al_xGa_{1-x}N$ layer 3 is etched and the lower AlN film layer 2 is exposed, $H_2$ continues to etch the AlN film layer 2 to form an etched irregular plain shape on the surface. When the GaN layer 4 is subsequently deposited, the growth rate of the GaN layer 4 on the surface of the etched AlN film layer is lower than that of the GaN layer 4 on the surface of the annealed $Al_xGa_{1-x}N$ layer 3 in island-like or irregular shape, thereby effectively buffering the stress between the subsequent epitaxial layer and the AlN film layer 2.

Embodiment 3

Figure 7:
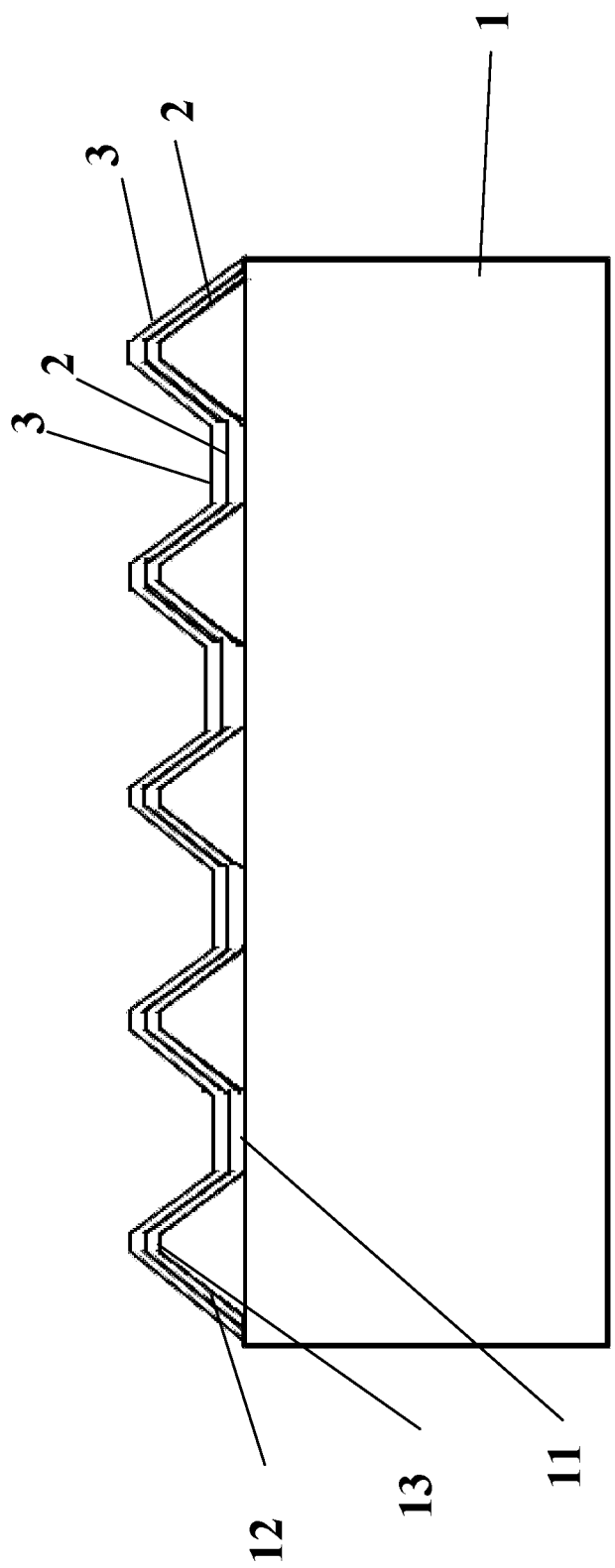
FIG. 7 is a schematic diagram showing the structure after growing of the $Al_xGa_{1-x}N$ ($0 \le x<1$) layer according to Embodiment III of the present invention.
Figure 8:
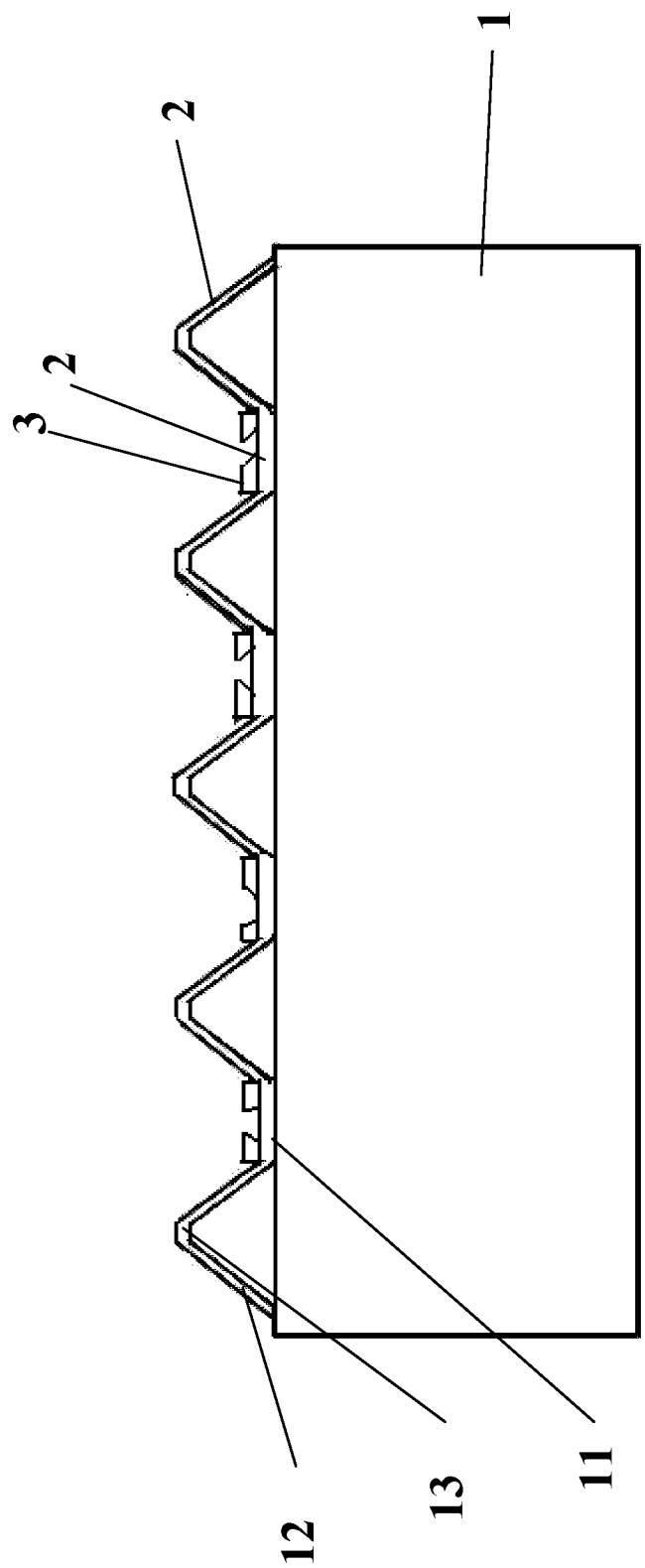
FIG. 8 is a schematic diagram showing the surface pattern after annealing of the $Al_xGa_{1-x}N$ ($0 \le x<1$) layer according to Embodiment III of the present invention.
Figure 9:
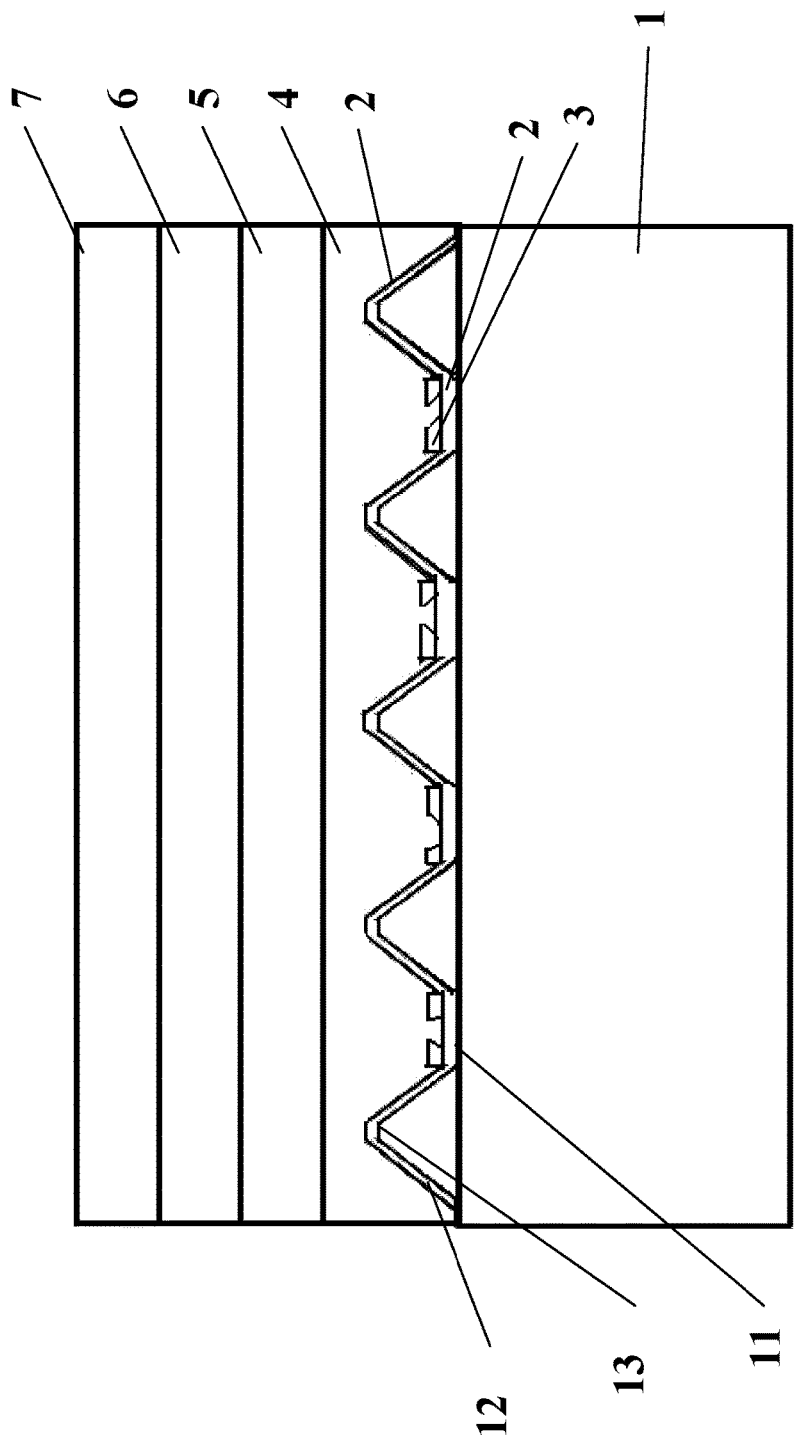
FIG. 9 is a structural diagram of a light emitting diode according to Embodiment III of the present invention.

Referring to FIGS. 7-9, the difference between this embodiment and Embodiment 1 is that: a patterned substrate 1 is adopted, preferably, a convex-patterned substrate, which may be a regularly-arranged convex pattern in plateau, taper or column shape fabricated through wet or dry etching. At first, put the patterned substrate 1 to the PVD chamber and deposit an AlN film layer 2, and transfer the substrate deposited with the AlN film layer 2 to the CVD chamber for epitaxial growth of an $Al_xGa_{1-x}N$ (0≤x<1) layer 3, which is covered on the bottom interval surface 11 and the top surface 12 and at the side wall 13 of the substrate pattern. Refer to FIG. 7 for the structural diagram. Then, take annealing under $H_2$ and $NH_3$ mixed atmosphere. Refer to Embodiment 1 for detailed annealing methods and conditions. Then, etch and re-crystallize the $Al_xGa_{1-x}N$ layer 3 on the bottom interval surface and the top surface and at the side wall of the pattern with high etching performance of $H_2$ and high-temperature conditions. As the $Al_xGa_{1-x}N$ layers at side wall and on top surface of the pattern is thinner than that on the bottom interval surface of the pattern, the $Al_xGa_{1-x}N$ layers at side wall and on top surface of the pattern can be effectively removed after this process while the $Al_xGa_{1-x}N$ layer on the bottom interval surface of the pattern is etched and re-crystallized to an irregular or island-like shape. Refer to FIG. 8 for the structural diagram. Finally, continue to grow a GaN layer 4 on the $Al_xGa_{1-x}N$ layer 3 in irregular or island-like shape, and deposit an n-type layer 5, a light-emitting layer 6 and a P-type layer 7 on the GaN layer 4. Refer to FIG. 9 for the structural diagram.

In this embodiment, after an AlN film layer 2 and an $Al_xGa_{1-x}N$ layer 3 are formed subsequently on the patterned substrate 1, if a GaN layer 4 is continually formed through epitaxial growth, the bottom interval 11, the top surface 12 and the side wall 13 of the pattern are prone to competing growth, which causes defects on surface and inside the subsequent epitaxial layer and increases leak current, thus influencing quality of the light emitting element; however, conventional high-temperature annealing (i.e., under $NH_3$ atmosphere) can neither effectively remove the $Al_xGa_{1-x}N$ layers 3 at side wall and on top surface, nor can it form an effective etching and re-crystallizing layer for the $Al_xGa_{1-x}N$ layer at pattern interval; instead, in this embodiment, annealing under $H_2$ and $NH_3$ mixed atmosphere is adopted so that the $Al_xGa_{1-x}N$ layers at side wall and on top surface of the pattern can be effectively removed while the $Al_xGa_{1-x}N$ layer 3 on the bottom interval surface of the pattern is etched and re-crystallized to an irregular or island-like shape. In subsequent depositing of an epitaxial layer, the stress between the epitaxial layer and the AlN film layer 2 can be effectively buffered to effectively eliminate defects caused by competing growth, to reduce abnormal current leakage and to improve the lattice quality and light-emitting efficiency of the light-emitting element.

Of course, based on the specific shape after annealing of the $Al_xGa_{1-x}N$ layer 3 required by actual production conditions, processing time and temperature under combination under $H_2$ and $NH_3$ mixed atmosphere can be flexibly adjusted to form a required surface shape of the annealed $Al_xGa_{1-x}N$ layer, and finally get best stress buffering effect.

Embodiment 4

Figure 10:
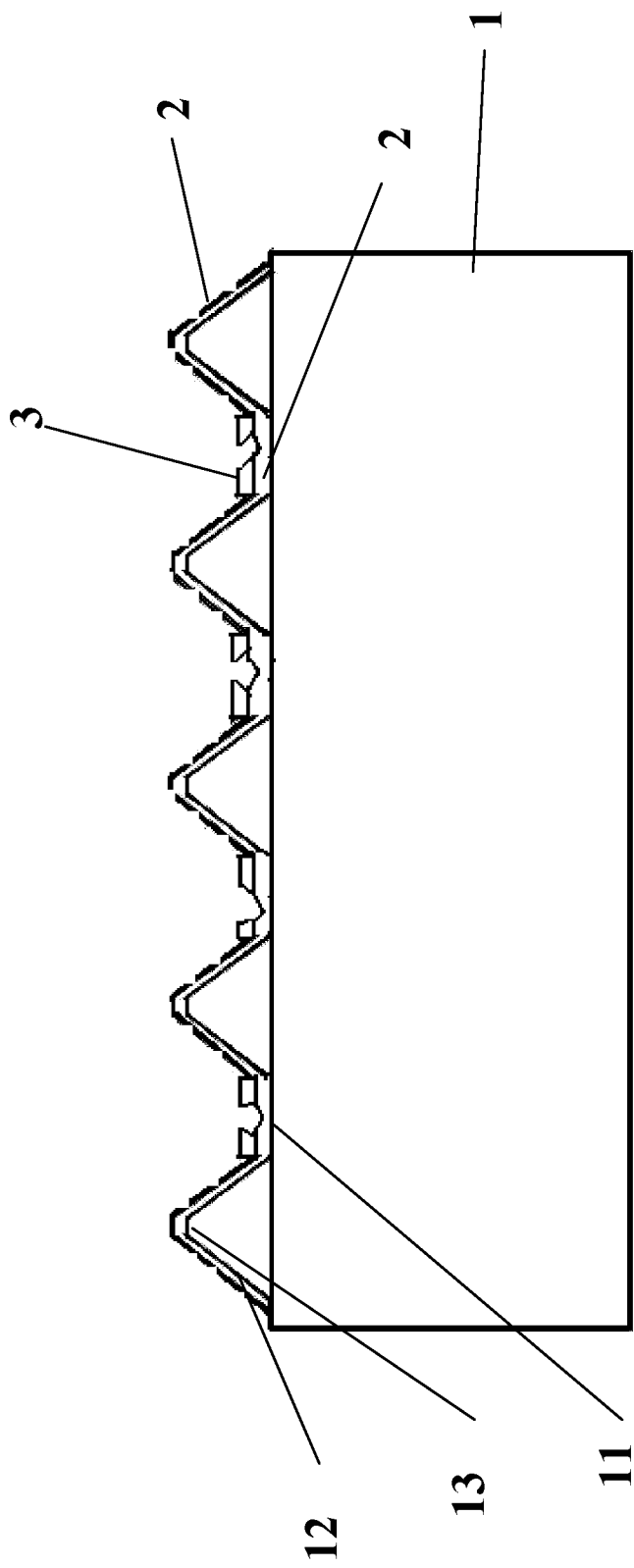
FIG. 10 is a schematic diagram showing the surface pattern after annealing of the $Al_xGa_{1-x}N$ ($0 \le x<1$) layer according to Embodiment IV of the present invention.

Referring to FIG. 10, the difference between this embodiment and Embodiment 2 is that: the substrate 1 provided is a patterned substrate, on which, growth and annealing steps in Embodiment 2 are performed in sequence.

All references referred to in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:
1. A method for manufacturing a light-emitting element, the method comprising:
  1) providing a substrate;
  2) depositing an AlN layer over a surface of the substrate via physical vapor deposition (PVD);
  3) inputting a metal source and $NH_3$, and depositing an $Al_xGa_{1-x}N$ (0≤x<1) layer over a surface of the AlN layer via metal-organic chemical vapor deposition (MOCVD);
  4) annealing the $Al_xGa_{1-x}N$ layer to form an $Al_xGa_{1-x}N$ layer in irregular or island-like shape, including: turning off the metal source and $NH_3$, keeping continual input of $H_2$, raising a chamber temperature, and annealing the $Al_xGa_{1-x}N$ layer under an $H_2$ atmosphere; continually raising the chamber temperature and inputting $NH_3$ while $H_2$ is being input; and continuing annealing the $Al_xGa_{1-x}N$ layer under an $NH_3/H_2$ mixed atmosphere;
  5) depositing a GaN layer over a surface of the annealed $Al_xGa_{1-x}N$ layer; and
  6) depositing an n-type layer, a light-emitting layer, and a P-type layer over a surface of the GaN layer.

2. The method of claim 1, wherein an annealing temperature under the $H_2$ atmosphere is 400-1200° C., and an annealing time is 100-600 s.

3. The method of claim 1, wherein an annealing temperature under the $NH_3/H_2$ mixed atmosphere is 400-1200° C., and an annealing time is 100-500 s.

4. The method of claim 1, wherein total annealing time under $H_2$ and $NH_3/H_2$ mixed atmosphere is 200-600 s.

5. The method of claim 1, wherein a growth temperature for the $Al_xGa_{1-x}N$ (0≤x<1) layer is 400-600° C.

6. The method of claim 1, wherein a thickness of the $Al_xGa_{1-x}N$ (0≤x<1) layer is 10-1000 Å.

7. The method of claim 1, wherein a thickness of the AlN layer is 10-350 Å.

8. The method of claim 1, wherein after annealing, the chamber temperature is adjusted to 950-1150° C. for depositing the GaN layer.

9. The method of claim 1, wherein the substrate is a plain substrate, a convex-patterned substrate, or a concave-patterned substrate.

10. A method for manufacturing a light-emitting element, comprising:
  1) providing a substrate;
  2) depositing an AlN layer over a surface of the substrate surface via physical vapor deposition (PVD);
  3) inputting a metal source and $NH_3$, and depositing an $Al_xGa_{1-x}N$ ($0 \leq x < 1$) layer over a surface of the AlN layer via metal-organic chemical vapor deposition (MOCVD);
  4) annealing the $Al_xGa_{1-x}N$ layer to form an $Al_xGa_{1-x}N$ layer in irregular or island-like shape, including: turning off the metal source and $NH_3$, keeping continual input of $H_2$, rising chamber temperature, and annealing the $Al_xGa_{1-x}N$ layer under $H_2$ atmosphere;
  5) depositing a GaN layer on the annealed $Al_xGa_{1-x}N$ layer surface; and
  6) depositing an n-type layer, a light-emitting layer and a P-type layer on the GaN layer surface.

11. The method of claim 10, wherein an annealing temperature under $H_2$ atmosphere is 400-1200° C., and annealing time is 100-600 s.

12. The method of claim 10, wherein a growth temperature for the $Al_xGa_{1-x}N$ ($0 \leq x < 1$) layer is 400-600° C.

13. The method of claim 10, wherein thickness of the $Al_xGa_{1-x}N$ ($0 \leq x < 1$) layer is 10-1000 Å.

14. The method of claim 10, wherein thickness of the AlN layer is 10-350 Å.

15. The method of claim 10, wherein after annealing, the chamber temperature is adjusted to 950-1150° C. for depositing the GaN layer.

16. The method of claim 10, wherein the substrate is a plain substrate, a convex-patterned substrate or a concave-patterned substrate.

* * * * *